(12) United States Patent
Sohn

(10) Patent No.: US 11,374,159 B2
(45) Date of Patent: Jun. 28, 2022

(54) COOLING/WARMING DEVICE

(71) Applicant: LG INNOTEK CO., LTD., Seoul (KR)

(72) Inventor: Hyung Min Sohn, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 191 days.

(21) Appl. No.: 16/630,955

(22) PCT Filed: Jul. 27, 2018

(86) PCT No.: PCT/KR2018/008562
§ 371 (c)(1),
(2) Date: Jan. 14, 2020

(87) PCT Pub. No.: WO2019/022570
PCT Pub. Date: Jan. 31, 2019

(65) Prior Publication Data
US 2020/0227611 A1    Jul. 16, 2020

(30) Foreign Application Priority Data
Jul. 28, 2017    (KR) ........................ 10-2017-0096479

(51) Int. Cl.
*F25B 21/02* (2006.01)
*H01L 35/32* (2006.01)

(52) U.S. Cl.
CPC .............. *H01L 35/32* (2013.01); *F25B 21/02* (2013.01)

(58) Field of Classification Search
CPC .. F25B 21/02; F25B 21/04; F25B 2321/0211; F25B 2321/023; F25B 2321/0251; H01L 35/32
See application file for complete search history.

(56) References Cited

U.S. PATENT DOCUMENTS

| 6,118,655 | A | 9/2000 | Mecredy, III et al. |
| 6,345,664 | B1 * | 2/2002 | Katsui ................ F28D 15/0266 165/80.3 |

(Continued)

FOREIGN PATENT DOCUMENTS

| CN | 102019866 | 4/2011 |
| CN | 102555869 | 7/2012 |

(Continued)

OTHER PUBLICATIONS

Machine Translation of WO2016159591, Won, Oct. 6, 2016; eSpacenet, all (Year: 2016).*

(Continued)

*Primary Examiner* — Filip Zec
(74) *Attorney, Agent, or Firm* — KED & Associates, LLP

(57) ABSTRACT

A cooling/warming device according to one embodiment of the present invention provides a cooling/warming device including a case including a lower case and an upper case coupled to the lower case, a fan which is accommodated in the case and circulates air introduced into the case, a thermoelectric device which is accommodated in the case, is disposed on a side surface of the fan, cools some air generated by the fan, and heats the remaining air, and a controller which is connected to the thermoelectric device and the fan and controls operation of the thermoelectric device and the fan. The thermoelectric device includes a first heat transmission member disposed at a side of the lower case, a second heat transmission member disposed at a side of the upper case, and a thermoelectric element disposed between the first heat transmission member and the second heat transmission member. The case includes an inlet through which air is introduced into the case, an air blow pipe through which air passing through the first heat transmission member flows, an air blow port from which the air flowing through the air blow pipe is discharged, a discharge (Continued)

pipe through which air passing through the second heat transmission member flows, and a discharge outlet from which the air flowing through the discharge pipe is discharged, and a bottom surface of the discharge pipe includes inclined regions having different heights at a predetermined point.

19 Claims, 11 Drawing Sheets

(56) References Cited

U.S. PATENT DOCUMENTS

| | | | |
|---|---|---|---|
| 9,036,348 B2* | 5/2015 | Huang | G06F 1/20 |
| | | | 361/695 |
| 10,436,459 B2* | 10/2019 | Jeon | F24F 1/24 |
| 10,871,291 B2* | 12/2020 | Lee | F24C 15/327 |
| 2007/0209369 A1 | 9/2007 | Ito et al. | |
| 2009/0193814 A1 | 8/2009 | Lofy | |
| 2010/0107656 A1 | 5/2010 | Nakaguro et al. | |
| 2011/0061400 A1 | 3/2011 | Park et al. | |
| 2012/0144844 A1 | 6/2012 | Park et al. | |
| 2018/0114891 A1 | 4/2018 | Won | |

FOREIGN PATENT DOCUMENTS

| | | |
|---|---|---|
| JP | 2000-124509 | 4/2000 |
| KR | 10-2006-0104294 | 10/2006 |
| KR | 10-2007-0099366 | 10/2007 |
| KR | 10-2011-0030192 | 3/2011 |
| KR | 10-2016-0115430 | 10/2016 |
| KR | 10-2017-0001438 | 1/2017 |
| WO | WO 2016/159591 | 10/2016 |

OTHER PUBLICATIONS

Korean Office Action dated Jun. 28, 2021 issued in Application No. 10-2017-0096479.
European Search Report dated Mar. 16, 2021 issued in Application No. 18837847.5.
Chinese Office Action dated Mar. 30, 2021 issued in Application No. 201880049482.6.
International Search Report dated Oct. 31, 2018 issued in Application No. PCT/KR2018/008562.

* cited by examiner

[FIG. 1]
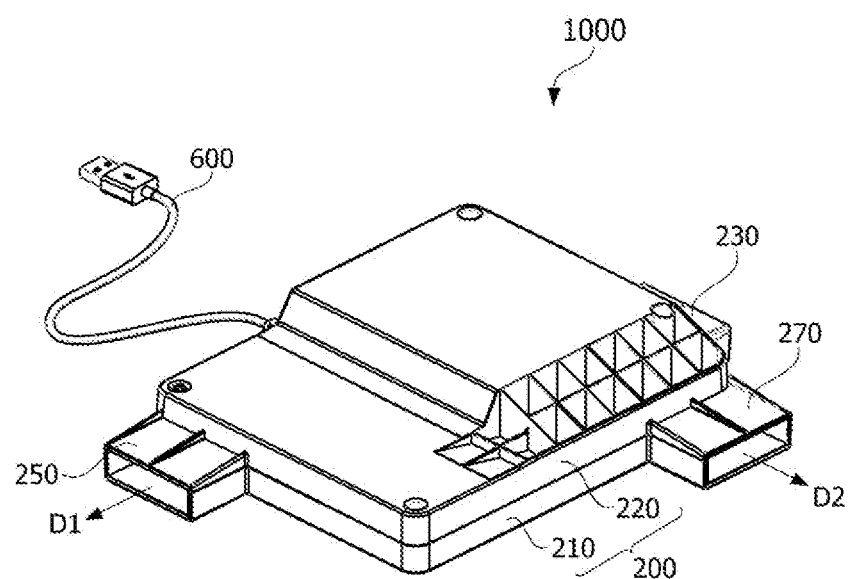

[FIG. 2]
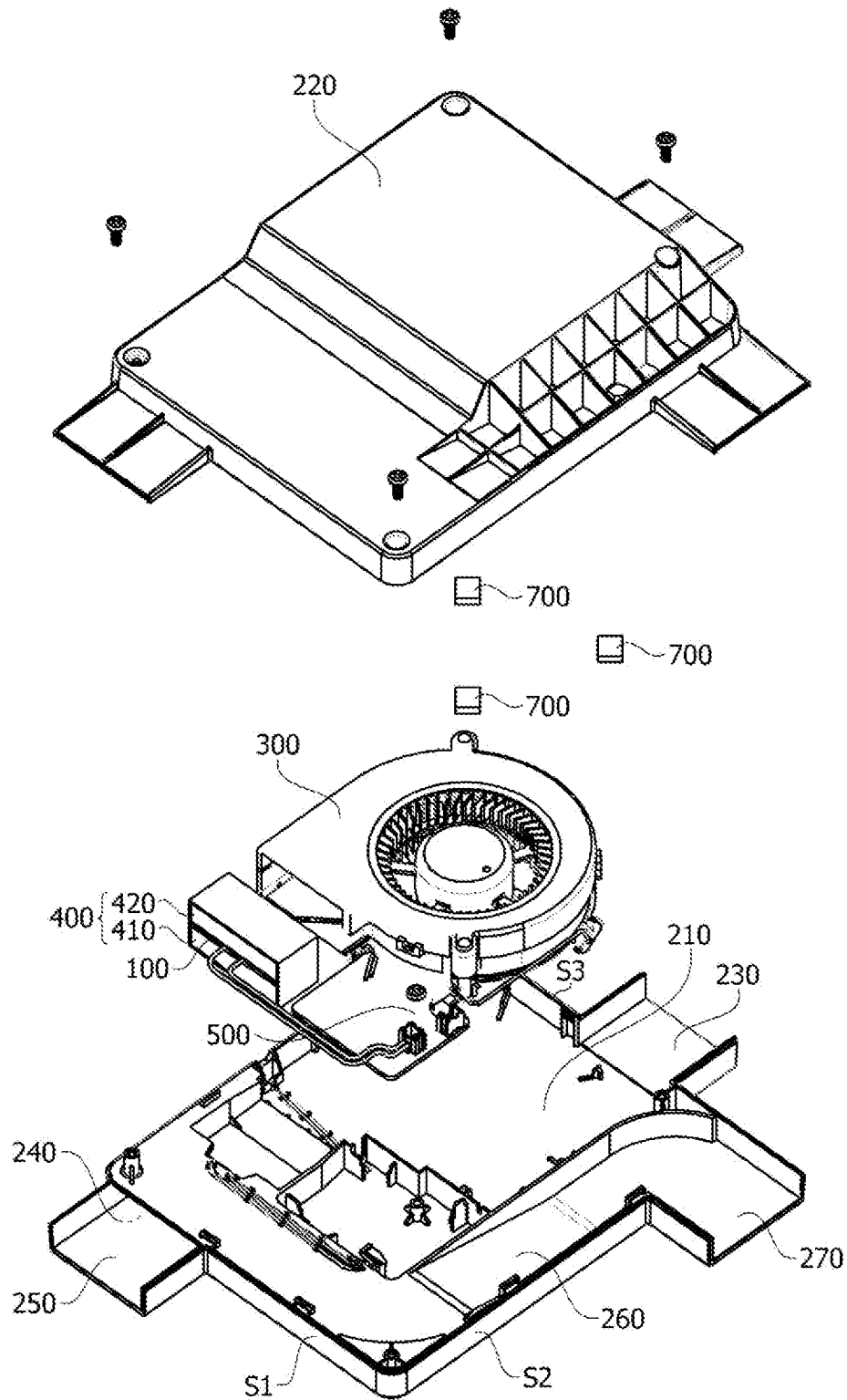

[FIG. 3]
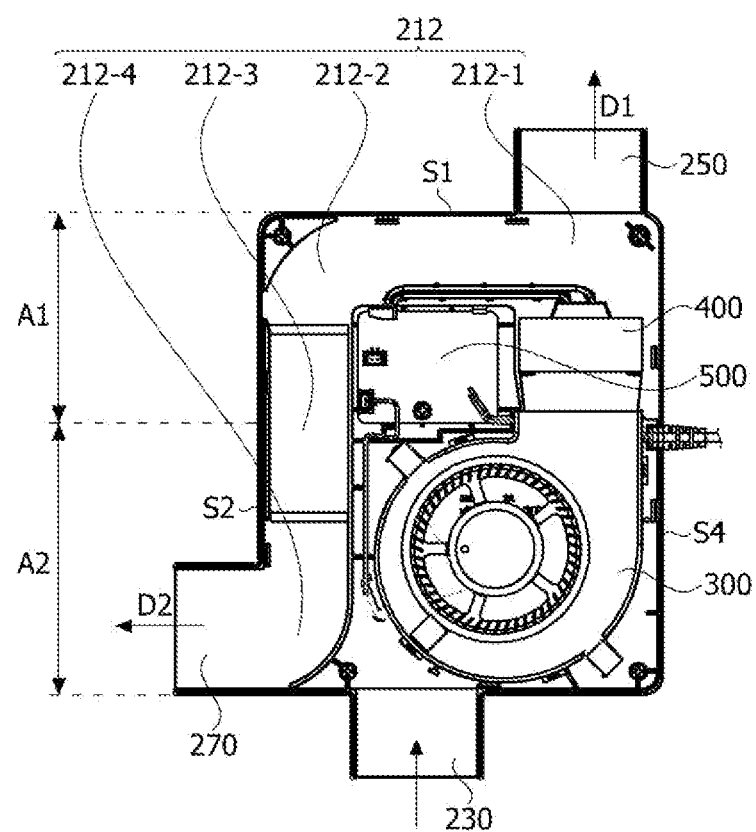

[FIG. 4]
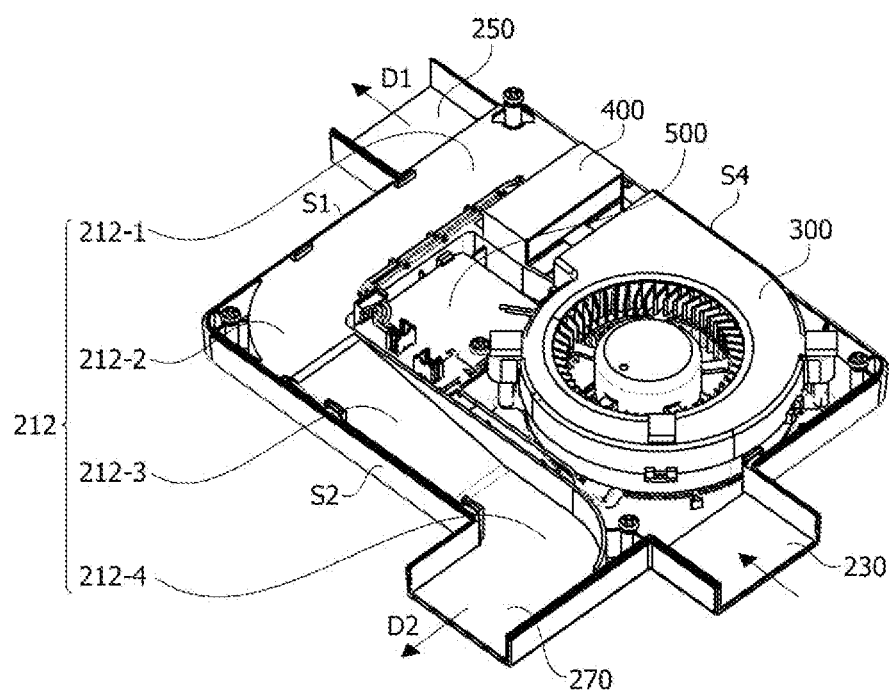
[FIG. 5]
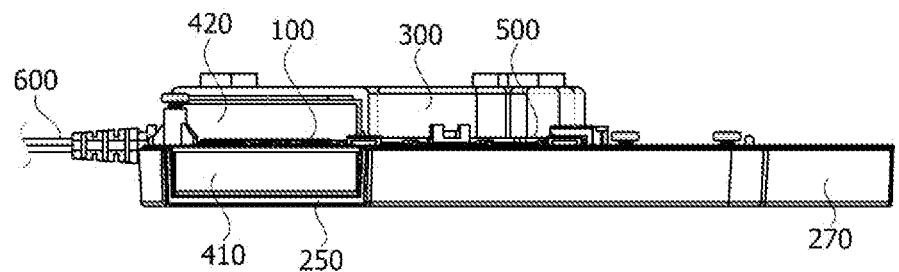

[FIG. 6]
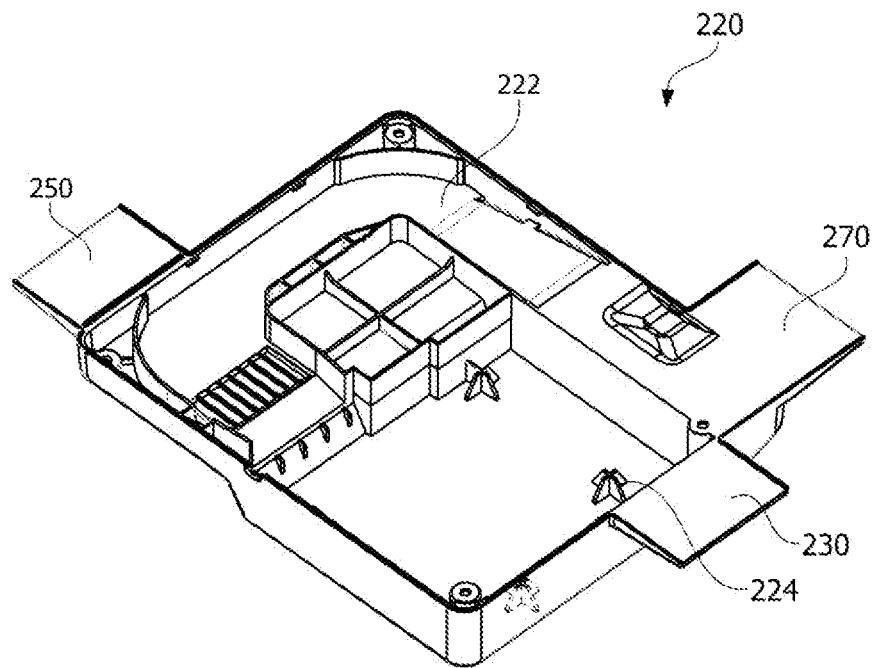
[FIG. 7]
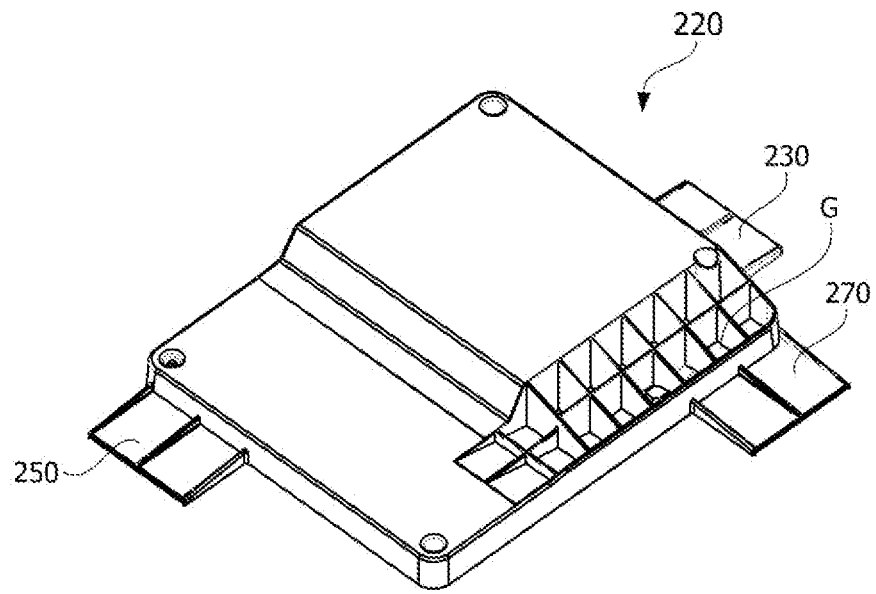

[FIG. 8]
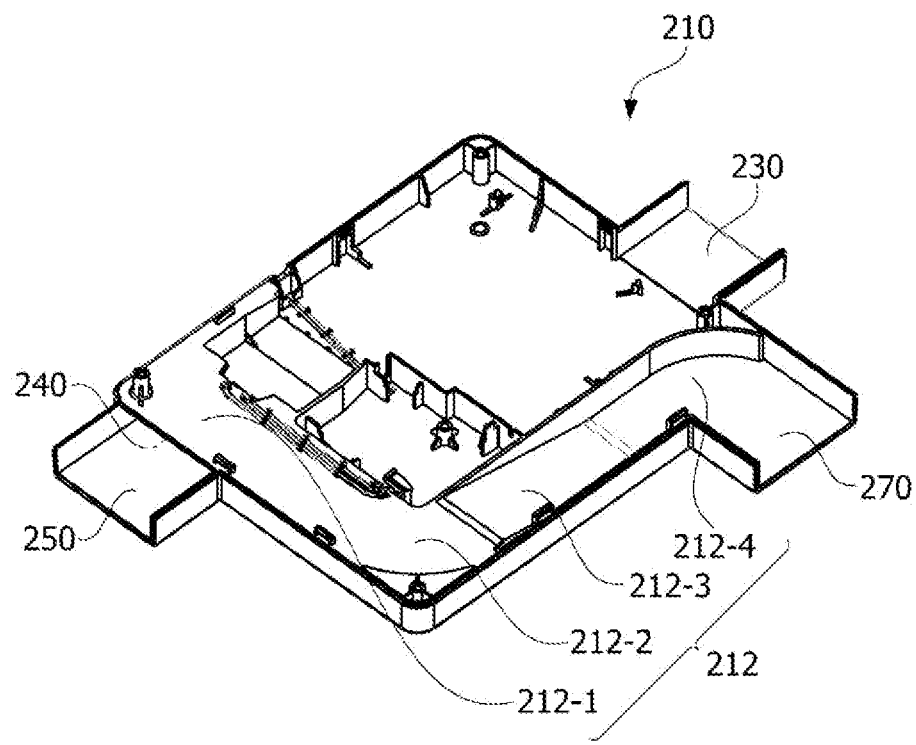
[FIG. 9]
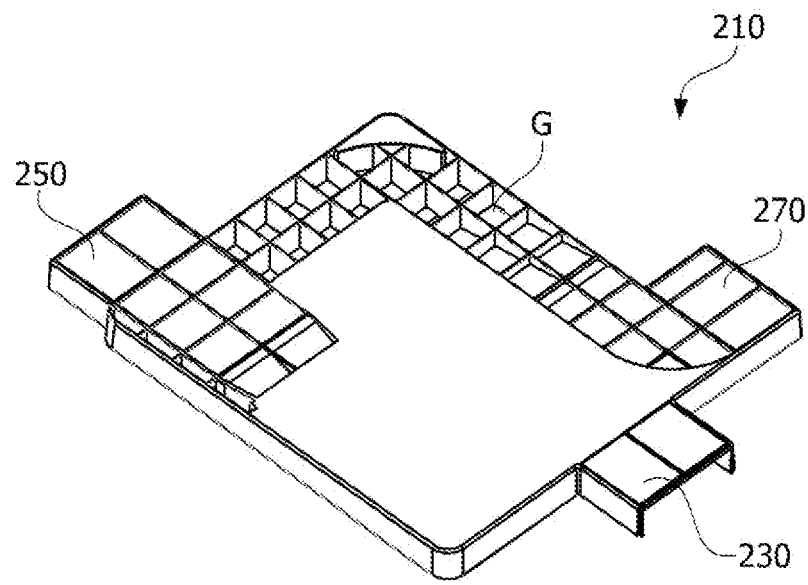

[FIG. 10]
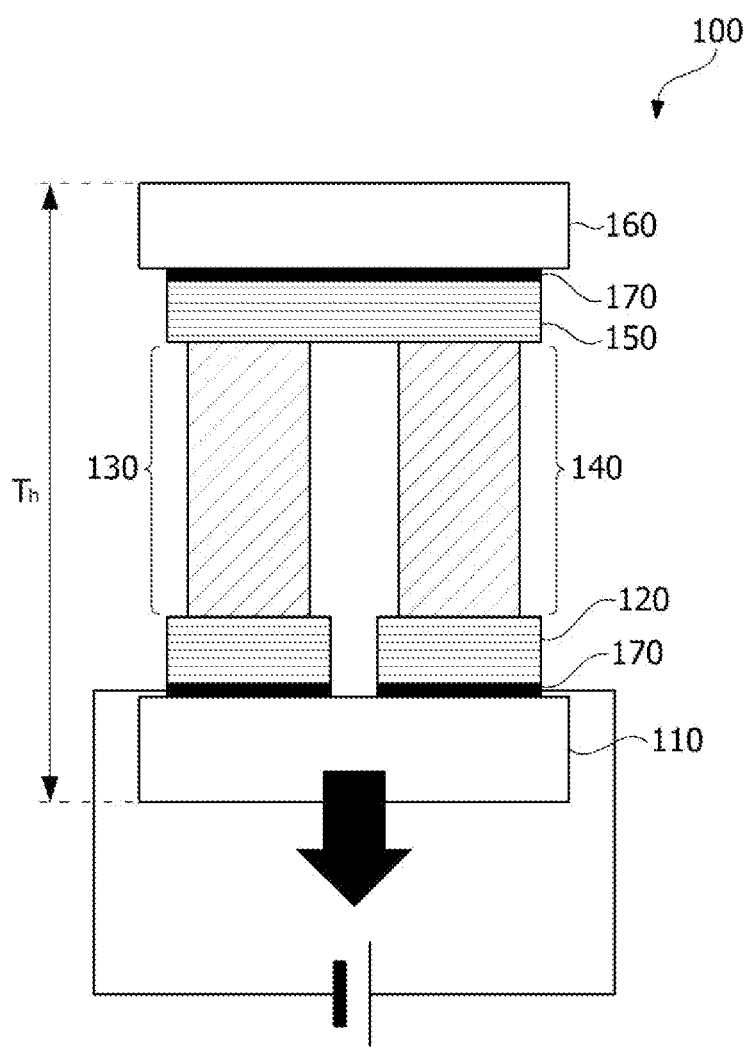

[FIG. 11]
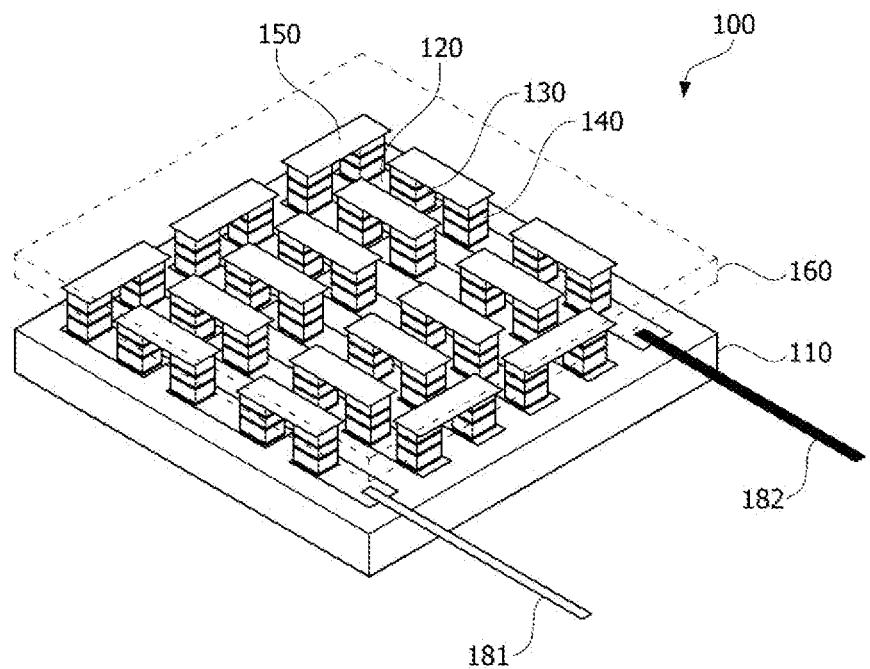
[FIG. 12]
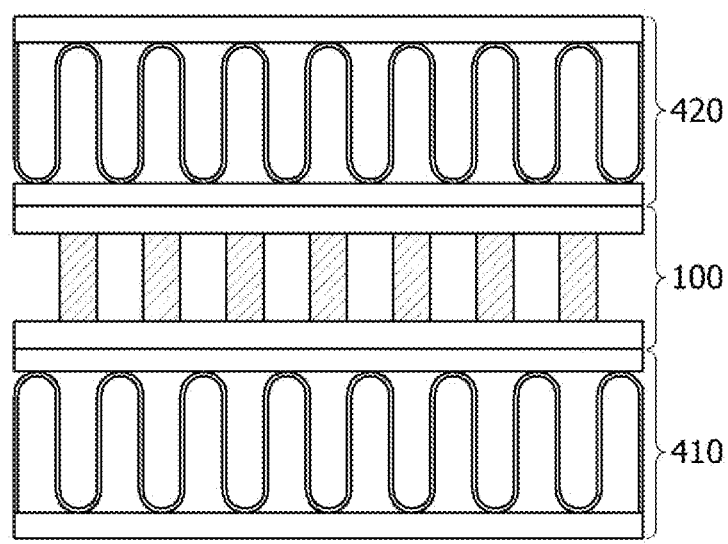

[FIG. 13]
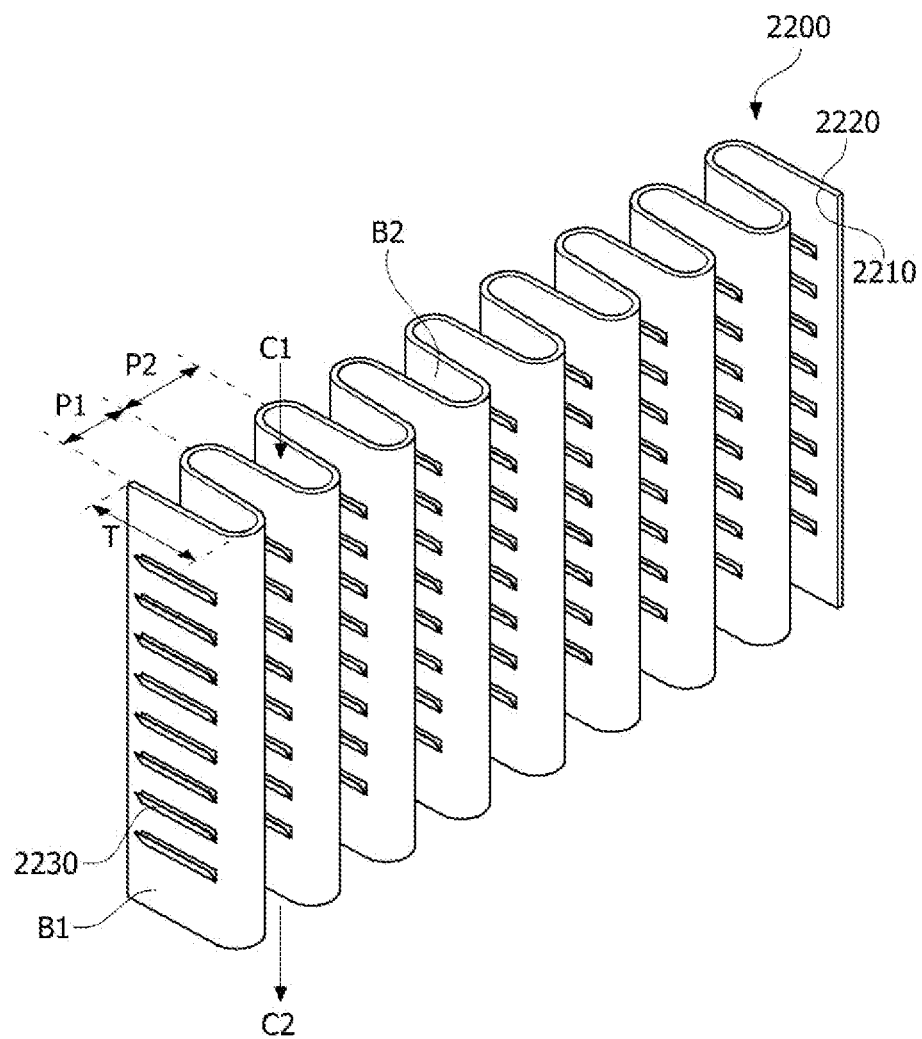

[FIG. 14]
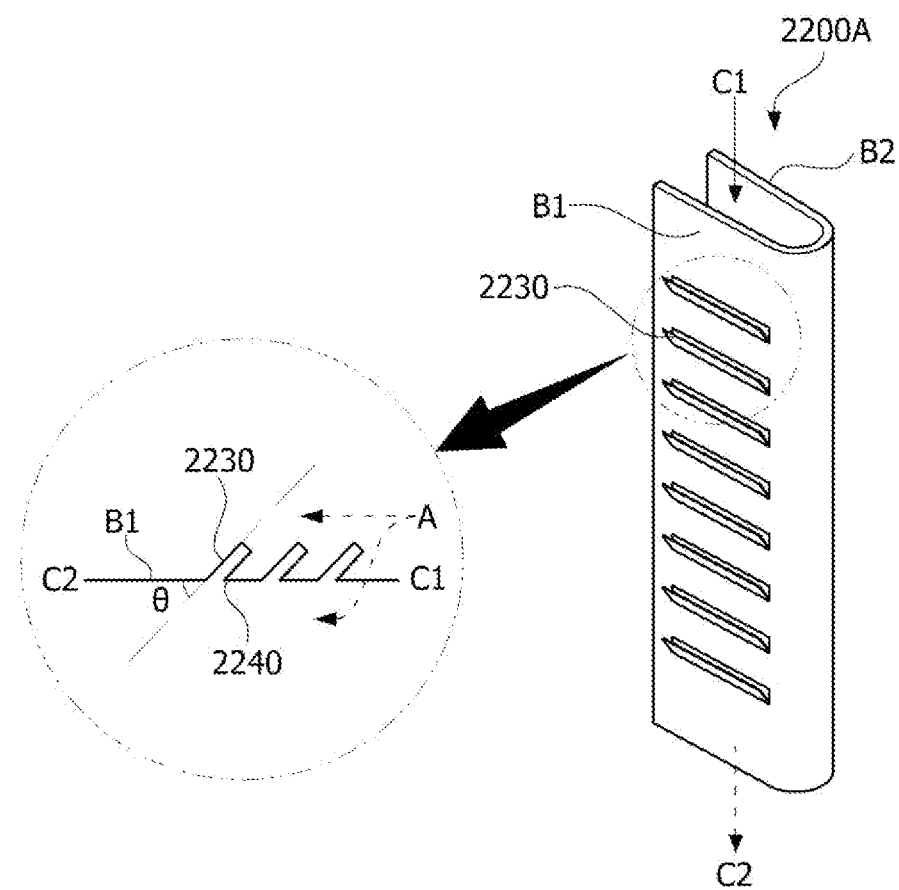

[FIG. 15]
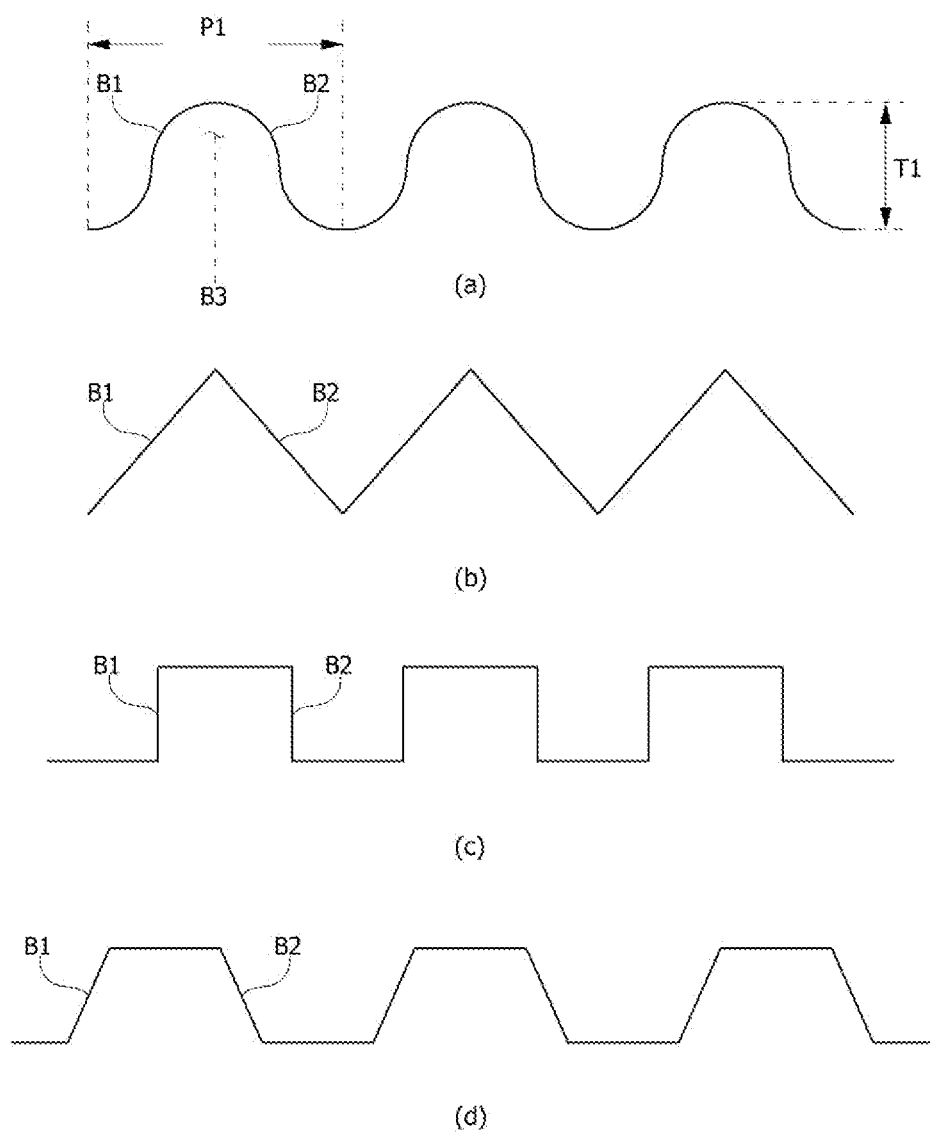

COOLING/WARMING DEVICE

CROSS-REFERENCE TO RELATED PATENT APPLICATIONS

This application is a U.S. National Stage Application under 35 U.S.C. § 371 of PCT Application No. PCT/KR2018/008562, filed Jul. 27, 2018, which claims priority to Korean Patent Application No. 10-2017-0096479, filed Jul. 28, 2017, whose entire disclosures are hereby incorporated by reference.

TECHNICAL FIELD

The present invention relates to a cooling/warming device, and more specifically, to a cooling/warming device including a thermoelectric element.

BACKGROUND ART

A thermoelectric effect is a phenomenon occurring due to movement of electrons and holes in a material and means direct energy conversion between heat and electricity.

A thermoelectric element is a generic term of elements in which a thermoelectric effect is used and has a structure in which P-type thermoelectric materials and N-type thermoelectric materials disposed between metal electrodes are bonded to form PN junction pairs.

Thermoelectric elements may be divided into elements which use a change in electrical resistance according to a change in temperature, elements which use the Seebeck effect in which an electromotive force is generated due to a difference in temperature, and elements which use the Peltier effect in which heating or heat absorption occurs due to a current.

Thermoelectric elements are being variously applied to home appliances, electronic components, communication components, and the like. For example, the thermoelectric elements may be applied to cooling apparatuses, heating apparatuses, power generation apparatuses, and the like. Therefore, the demand for heat conversion performance of the thermoelectric elements is gradually increasing.

In a case in which the thermoelectric element is applied to a cooling device or a warming device, air introduced into the device is cooled at a side of a heat-absorbing portion of the thermoelectric element, heated at a side of a heating portion thereof, and discharged. In this case, the cooled air and the heated air should not be mixed to be discharged in order to achieve a proper cooling/warming effect. To this end, a design of effective air flow path in the device is required.

DISCLOSURE

Technical Problem

The present invention is directed to providing a cooling/warming device using a thermoelectric element configured to effectively discharge cool air or warm air.

Technical Solution

One aspect of the present invention provides a cooling/warming device including a case including a lower case and an upper case coupled to the lower case, a fan which is accommodated in the case and circulates air introduced into the case, a thermoelectric device which is accommodated in the case, is disposed on a side surface of the fan, cools some air generated by the fan, and heats the remaining air, and a controller which is connected to the thermoelectric device and the fan and controls operation of the thermoelectric device and the fan. The thermoelectric device includes a first heat transmission member disposed at a side of the lower case, a second heat transmission member disposed at a side of the upper case, and a thermoelectric element disposed between the first heat transmission member and the second heat transmission member, wherein the thermoelectric element includes a first substrate disposed at a side of the first heat transmission member, a second substrate disposed at a side of the second heat transmission member, and a plurality of P-type thermoelectric legs and a plurality of N-type thermoelectric legs alternately disposed between the first substrate and the second substrate. The case includes an inlet through which air is introduced into the case, an air blow pipe through which air passing through the first heat transmission member flows, an air blow port from which the air flowing through the air blow pipe is discharged, a discharge pipe through which air passing through the second heat transmission member flows, and a discharge outlet from which the air flowing through the discharge pipe is discharged, and a bottom surface of the discharge pipe includes inclined regions having different heights at a predetermined point.

The bottom surface of the discharge pipe may further include a dividing region which divides the air passing through the first heat transmission member from the air passing through the second heat transmission member, a bent region which changes a path of the air passing through the second heat transmission member, and a discharge region from which the air passing through the second heat transmission member is discharged to the discharge outlet, wherein the inclined region may be disposed between the bent region and the discharge region.

A height of a bottom surface of the bent region may be higher than a height of a bottom surface of the discharge region.

The inclined region may have any one form among a slope in a linear type, a slope having a curvature, and a step in a stair type.

A direction in which air is blown through the air blow port may be different from a direction in which air is discharged through the discharge outlet.

The air blow port may be disposed on a first side surface of the lower case, and the inlet may be disposed on a third side surface opposite to the first side surface.

The discharge outlet may be disposed on a second side surface between the first side surface and the third side surface.

The first side surface may be a surface disposed in a direction in which air generated by the fan passes through the first heat transmission member and the second heat transmission member.

The discharge outlet may be formed in a region of the second side surface which is closer to the third side surface than the first side surface.

The bent region of the discharge pipe may be formed to be bent from an outlet, from which the air passing through the second heat transmission member is discharged, to the discharge outlet while having a predetermined curvature.

The discharge pipe may be formed due to a space between the lower case and the upper case, and air flowing through the air blow pipe and air flowing through the discharge pipe may not be mixed.

The dividing region of the discharge pipe may be disposed between an outlet through which the air passing through the first heat transmission member is discharged and an outlet through which the air passing through the second heat transmission member is discharged to be parallel to the first substrate and the second substrate of the thermoelectric device, and the bent region may be disposed between the dividing region and the inclined region.

The air blow pipe may be disposed between a bottom surface of the lower case and the dividing region.

The cooling/warming may further include two or more buffer members disposed on an upper surface of the fan, wherein the buffer member may be in contact with the upper case.

Two or more protrusions may be formed on an inner surface of the upper case, and the buffer member may be in contact with the protrusion.

A plurality of grooves may be formed in at least one outer surface of the upper case and the lower case.

The plurality of grooves may be formed in a region corresponding to the inclined region of the outer surface of the lower case.

The plurality of grooves of the lower case may include a predetermined inclination and a predetermined pattern.

A depth of the groove may range from 0.5 to 1.5 times a width of the groove.

When cooled air is discharged through the air blow port, heated air may be discharged through the discharge outlet, and when heated air is discharged through the air blow port, cooled air may be discharged through the discharge outlet.

Advantageous Effects

According to embodiments of the present invention, a cooling/warming device using a thermoelectric element can be obtained. Particularly, when the cooling/warming device according to the embodiments of the present invention is used, since air can be effectively blown through an air blow port and air can be effectively discharged through a discharge outlet, the cooling/warming device with high performance can be obtained.

In addition, according to the embodiments of the present invention, the cooling/warming device with low noise, light weight, and slim design can be obtained.

The cooling/warming device according to the embodiments of the present invention can be variously installed in and applied to home appliances, electronic components, communication components, outdoor products, and the like.

DESCRIPTION OF DRAWINGS

FIG. 1 is a perspective view illustrating a cooling/warming device according to one embodiment of the present invention.

FIG. 2 is an exploded perspective view illustrating the cooling/warming device according to one embodiment of the present invention.

FIG. 3 is a top view illustrating a fan, a thermoelectric device, and a controller which are disposed in a lower case of the cooling/warming device according to one embodiment of the present invention.

FIG. 4 is a perspective view of FIG. 3.

FIG. 5 is a side view of FIG. 3.

FIG. 6 is a perspective view illustrating an interior of an upper case of the cooling/warming device according to one embodiment of the present invention.

FIG. 7 is a perspective view illustrating an exterior of the upper case of the cooling/warming device according to one embodiment of the present invention.

FIG. 8 is a perspective view illustrating an interior of the lower case of the cooling/warming device according to one embodiment of the present invention.

FIG. 9 is a perspective view illustrating an exterior of the lower case of the cooling/warming device according to one embodiment of the present invention.

FIG. 10 is a cross-sectional view illustrating a thermoelectric element included in the cooling/warming device according to one embodiment of the present invention.

FIG. 11 is a perspective view illustrating the thermoelectric element included in the cooling/warming device according to one embodiment of the present invention.

FIG. 12 is a cross-sectional view illustrating the thermoelectric device of the cooling/warming device according to one embodiment of the present invention.

FIGS. 13 to 15 are views for describing a heat transmission member included in the cooling/warming device according to one embodiment of the present invention.

MODES OF THE INVENTION

Hereinafter, exemplary embodiments of the present invention will be described with reference to the accompanying drawings.

However, the technical spirit of the present invention is not limited to some embodiments which will be described and may be realized using various other embodiments, and at least one component of the embodiments may be selectively coupled, substituted, and used to realize the technical spirit within the range thereof.

In addition, unless clearly and specifically defined otherwise by context, all terms (including technical and scientific terms) used herein can be interpreted as having customary meanings to those skilled in the art, and meanings of generally used terms, such as those defined in commonly used dictionaries, will be interpreted by considering contextual meanings of the related technology.

In addition, the terms used in the embodiments of the present invention are considered in a descriptive sense and not for limiting the present invention.

In the present specification, unless clearly indicated otherwise by the context, singular forms include the plural forms thereof, and in a case in which "at least one (or one or more) among A, B, and C" is described, this may include at least one combination among all combinations which can be combined with A, B, and C.

In descriptions of components of the present invention, terms such as "first," "second," "A," "B," "(a)," and "(b)" can be used.

The terms are only to distinguish one element from another element, and an essence, order, and the like of the element are not limited by the terms.

It should be understood that, when an element is referred to as being "connected or coupled" to another element, such a description may include both a case in which the element is directly connected or coupled to another element, and a case in which the element is connected or coupled to another element with still another element disposed therebetween.

In a case in which any one element is described as being formed or disposed "on or under" another element, such a description includes both cases in which the two elements are formed or disposed to be in direct contact with each other and one or more other elements are interposed between the two elements. In addition, when one element is described as being formed "on or under" another element, such a description may include a case in which the one element is formed at an upper side or a lower side with respect to another element.

FIG. 1 is a perspective view illustrating a cooling/warming device according to one embodiment of the present invention, FIG. 2 is an exploded perspective view illustrating the cooling/warming device according to one embodiment of the present invention, FIG. 3 is a top view illustrating a fan, a thermoelectric device, and a controller which are disposed in a lower case of the cooling/warming device according to one embodiment of the present invention, FIG. 4 is a perspective view of FIG. 3. FIG. 5 is a side view of FIG. 3, FIG. 6 is a perspective view illustrating an interior of an upper case of the cooling/warming device according to one embodiment of the present invention, FIG. 7 is a perspective view illustrating an exterior of the upper case of the cooling/warming device according to one embodiment of the present invention, FIG. 8 is a perspective view illustrating an interior of the lower case of the cooling/warming device according to one embodiment of the present invention, FIG. 9 is a perspective view illustrating an exterior of the lower case of the cooling/warming device according to one embodiment of the present invention, FIG. 10 is a cross-sectional view illustrating a thermoelectric element included in the cooling/warming device according to one embodiment of the present invention, FIG. 11 is a perspective view illustrating the thermoelectric element included in the cooling/warming device according to one embodiment of the present invention, FIG. 12 is a cross-sectional view illustrating the thermoelectric device of the cooling/warming device according to one embodiment of the present invention, and FIGS. 13 to 15 are views for describing a heat transmission member included in the cooling/warming device according to one embodiment of the present invention.

Referring to FIGS. 1 to 9, a cooling/warming device 1000 includes a case 200 having a lower case 210 and an upper case 220 connected to the lower case 210, a fan 300 accommodated in the case 200 and configured to circulate air introduced into the case 200, a thermoelectric device 400 accommodated in the case 200, disposed on a side surface of the fan 300, and configured to cool some air circulated by the fan 300 and to heat some air which is remaining, and a controller 500 connected to the thermoelectric device 400 and the fan 300 and configured to control operation of the thermoelectric device 400 and the fan 300.

The fan 300, the thermoelectric device 400, and the controller 500 may be connected to a cable 600 and may receive external power through the cable 600. In addition, the fan 300, the thermoelectric device 400, and the controller 500 may also receive power from a pre-installed battery.

The controller 500 may include a printed circuit board and an electronic component mounted on the printed circuit board. The controller 500 may also include a communication module and may control operation of the thermoelectric device 400 and the fan 300 using a signal received from the outside through the communication module. For example, the communication module may use Bluetooth, short range wireless communication, Wi-Fi, or the like.

The thermoelectric device 400 includes a first heat transmission member 410 disposed at a side of the lower case 210, a second heat transmission member 420 disposed at a side of the upper case 220, and a thermoelectric element 100 disposed between the first heat transmission member 410 and the second heat transmission member 420.

Referring to FIGS. 10 to 12, the thermoelectric element 100 according to the embodiment of the present invention includes a lower substrate 110, lower electrodes 120, a P-type thermoelectric leg 130, an N-type thermoelectric leg 140, an upper electrode 150, and an upper substrate 160.

The lower electrodes 120 are disposed between the lower substrate 110 and lower floor surfaces of the P-type thermoelectric leg 130 and the N-type thermoelectric leg 140, and the upper electrode 150 is disposed between the upper substrate 160 and upper floor surfaces of the P-type thermoelectric leg 130 and the N-type thermoelectric leg 140. Accordingly, a plurality of P-type thermoelectric legs 130 and a plurality of N-type thermoelectric legs 140 are electrically connected by lower electrodes 120 and upper electrodes 150. The pair of P-type thermoelectric leg 130 and N-type thermoelectric leg 140 which are disposed between the lower electrodes 120 and the upper electrode 150 and electrically connected to each other may form a unit cell.

For example, when a voltage is applied between the lower electrodes 120 and the upper electrode 150 through lead wires 181 and 182, due to the Peltier effect, the substrate through which a current flows from the P-type thermoelectric leg 130 to the N-type thermoelectric leg 140 absorbs heat and thus serves as a cooling part, and the substrate through which a current flows from the N-type thermoelectric leg 140 to the P-type thermoelectric leg 130 is heated and thus serves as a heating part. In the present specification, the heat-absorbing surface may also be one surface of the substrate serving as the cooling part, and the heating surface may also be one surface of the substrate serving as the heating part.

Here, the P-type thermoelectric leg 130 and the N-type thermoelectric leg 140 may be bismuth-telluride (Bi—Te)-based thermoelectric legs mainly including bismuth (Bi) and tellurium (Te). The P-type thermoelectric leg 130 may be a thermoelectric leg including a Bi—Te-based main material containing at least one among antimony (Sb), nickel (Ni), aluminum (Al), copper (Cu), silver (Ag), lead (Pb), boron (B), gallium (Ga), tellurium (Te), bismuth (Bi), and indium (In) in the range of 99 to 99.999 wt % and a mixture containing Bi or Te in the range of 0.001 to 1 wt % based on a total weight of 100 wt %. For example, a main material of the P-type thermoelectric leg 130 may be Bi-selenium (Se)—Te, and the P-type thermoelectric leg 130 may further include Bi or Te in the range of 0.001 to 1 wt % based on a total weight. The N-type thermoelectric leg 140 may be a thermoelectric leg including a Bi—Te-based main material containing at least one among Se, Ni, Cu, Ag, Pb, B, Ga, Te, Bi, and In in the range of 99 to 99.999 wt % and a mixture containing Bi or Te in the range of 0.001 to 1 wt % based on a total weight of 100 wt %. For example, a main material of the N-type thermoelectric leg 140 may be Bi—Sb—Te, and the N-type thermoelectric leg 140 may further include Bi or Te in the range of 0.001 to 1 wt % based on a total weight.

The P-type thermoelectric leg 130 and the N-type thermoelectric leg 140 may be formed in a bulk type or a stacked type. Generally, the bulk type P-type thermoelectric leg 130 or the bulk type N-type thermoelectric leg 140 may be formed by performing a thermal process on a thermoelectric material to manufacture an ingot, grinding and straining the ingot to obtain a powder for a thermoelectric leg, sintering the powder, and cutting a sintered body. The stacked type P-type thermoelectric leg 130 or the stacked type N-type thermoelectric leg 140 may be formed by coating a sheet-shaped base with a paste including a thermoelectric material to form unit members, stacking the unit members, and cutting the stacked unit members.

In this case, the pair of P-type thermoelectric leg 130 and N-type thermoelectric leg 140 may have the same shape and volume or may have different shapes and volumes. For example, since electrical conduction properties of the P-type thermoelectric leg 130 and the N-type thermoelectric leg 140 are different, a height or cross sectional area of the N-type thermoelectric leg 140 may be different from that of the P-type thermoelectric leg 130.

The performance of the thermoelectric element according to one embodiment of the present invention may be expressed as a Seebeck index. The Seebeck index (ZT) may be expressed by Equation 1.

$$ZT=\alpha^2 \sigma T/k \qquad \text{[Equation 1]}$$

In this case, α is the Seebeck coefficient [V/K], σ is electric conductivity [S/m], α2σ is a power factor [W/mK2]. In addition, T is temperature, k is thermal conductivity [W/mK]. K may be expressed as a·cp·ρ, wherein a thermal diffusivity [cm2/S], cp is specific heat [J/gK], and ρ is density [g/cm3].

In order to obtain a Seebeck index of a thermoelectric element, a Z value [V/K] is measured using a Z meter, and then, the Seebeck index (ZT) may be calculated using the measured Z value.

Meanwhile, each of the lower electrodes 120 disposed between the lower substrate 110 and the P-type thermoelectric leg 130 and between the lower substrate 110 and the N-type thermoelectric leg 140, and the upper electrode 150 disposed between the upper substrate 160 and the P-type thermoelectric leg 130 and between the upper substrate 160 and the N-type thermoelectric leg 140 may include at least one among Cu, Ag, and Ni and may have a thickness in the range of 0.01 mm to 0.3 mm. In a case in which a thickness of the lower electrode 120 or the upper electrode 150 is less than 0.01 mm, an electrode function thereof is degraded so that electric conductivity performance thereof may be lowered, and in a case in which the thickness thereof is greater than 0.3 mm, resistance thereof increases so that conduction efficiency thereof may be lowered.

In addition, the lower substrate 110 and the upper substrate 160 which face each other may be insulating substrates or metal substrates. The insulating substrate may be an alumina substrate or flexible polymer resin substrate. The flexible polymer resin substrate may include any insulating resin material such as high permeability plastics including polyimide (PI), polystyrene (PS), poly methyl methacrylate (PMMA), a cyclic olefin copolymer (COC), polyethylene terephthalate (PET), or a resin. The metal substrate may include Cu, a Cu alloy, or a Cu—Al alloy, and a thickness thereof may be in the range of 0.1 mm to 0.5 mm. In a case in which the thickness of the metal substrate is less than 0.1 mm or greater than 0.5 mm, since a heat dissipation property or thermal conductivity thereof may become excessively high, the reliability of the thermoelectric element may be lowered. In addition, in a case in which the lower substrate 110 and the upper substrate 160 are the metal substrates, dielectric layers 170 may be further formed between the lower substrate 110 and the lower electrodes 120 and between the upper substrate 160 and the upper electrode 150. The dielectric layer 170 may include a material having a thermal conductivity in the range of 5 to 10 W/K and may have a thickness in the range of 0.01 mm to 0.15 mm. In a case in which the thickness of the dielectric layer 170 is less than 0.01 mm, insulating efficiency or a withstanding voltage property may be lowered, and in a case in which the thickness thereof is greater than 0.15 mm, thermal conductivity is lowered so that heat dissipation efficiency may be lowered.

Here, sizes of the lower substrate 110 and the upper substrate 160 may also be different. For example, a volume, a thickness, or an area of one of the lower substrate 110 and the upper substrate 160 may be greater than that of the other. Accordingly, the heat absorption or dissipation performance of the thermoelectric element can be enhanced.

In addition, a heat dissipation pattern, for example, an irregular pattern, may also be formed on at least one surface of the lower substrate 110 and the upper substrate 160. Accordingly, the heat dissipation performance of the thermoelectric element can be enhanced. In a case in which the irregular pattern is formed on a surface in contact with the P-type thermoelectric leg 130 or N-type thermoelectric leg 140, a bonding property between the thermoelectric leg and the substrate can also be improved.

Meanwhile, the P-type thermoelectric leg 130 or N-type thermoelectric leg 140 may have a cylindrical form, a polygonal column form, an elliptical column form, or the like.

In addition, the P-type thermoelectric leg 130 or the N-type thermoelectric leg 140 may also have a stacked type structure. For example, the P-type thermoelectric leg or the N-type thermoelectric leg may be formed through a method in which a plurality of structures applied with a semiconductor material are stacked on a base member having a sheet form and are cut. Accordingly, material loss can be prevented, and an electrical conductivity property can be improved.

Alternatively, the P-type thermoelectric leg 130 or the N-type thermoelectric leg 140 may be manufactured through a zone melting method or a powder sintering method. In the zone melting method, after an ingot is manufactured using a thermoelectric material, the ingot is slowly heated and refined such that particles are rearranged in a single direction and is slowly cooled to obtain a thermoelectric leg. In the powder sintering method, after an ingot is manufactured using a thermoelectric material, the ingot is grinded and strained to obtain a powder for a thermoelectric leg, and a sintering process is performed on the powder to obtain a thermoelectric leg.

The lower substrate 110 may be disposed on a side of the first heat transmission member 410, and the upper substrate 160 may be disposed on a side of the second heat transmission member 420. In this case, the lower substrate 110 may be directly or indirectly connected to the first heat transmission member 410, and the upper substrate 160 may be directly or indirectly connected to the second heat transmission member 420.

In a case in which the lower substrate 110 is a heat-absorbing portion and the upper substrate 160 is a heating portion, cooled air may be discharged through the first heat transmission member 410, and heated air may be discharged through the second heat transmission member 420. Conversely, in a case in which the lower substrate 110 is a heating portion, and the upper substrate 160 is a heat-absorbing portion, heated air may be discharged through the first heat transmission member 410, and cooled air may be discharged through the second heat transmission member 420.

In this case, the first heat transmission member 410 and the second heat transmission member 420 may be formed to have various forms to increase contact areas with air. For example, the first heat transmission member 410 and the second heat transmission member 420 may have structures illustrated in FIGS. 13 to 15. Referring to FIGS. 13 to 15, a heat transmission member 2200 according to the embodiment of the present invention may include at least one flow path pattern 2200A forming an air flow path C1 using a base member including a first flat surface 2210 and a second flat surface 2220 and having a flat plate form.

As illustrated in FIGS. 13 to 15, the flow path pattern 2200A may have a structure in which the base member is folded to form a curvature pattern having predetermined pitches P1 and P2 and a predetermined height T1, that is, a folded structure.

As described above, air comes into surface-contact with the first flat surface 2210 and the second flat surface 2220 of the heat transmission member 2200, and an area with which the air comes into contact may be maximized due to the flow path pattern 200A.

Referring to FIG. 13, in a case in which air is introduced in the flow path direction C1, air may move while uniformly coming into contact with the first flat surface 2210 and the second flat surface 2220 and move in a flow path direction C2. Accordingly, since a contact surface is large when compared to a base member having a simple flat plate form, a heat-absorbing or heating effect is improved.

According to the embodiment of the present invention, in order to further increase a contact area with air, a protruding resistive pattern 2230 may also be formed on the base member.

In addition, as illustrated in FIG. 14, the resistive pattern 2230 may be formed as a protruding structure inclined at a predetermined inclination θ in a direction in which air is introduced. Accordingly, since friction between the resistive pattern 2230 and the air may be maximized, a contact surface can be increased or contact efficiency can be improved. In addition, a groove 2240 may also be formed in a surface of a front portion of the resistive pattern 2230 of the base member. Since some air coming into contact with the resistive pattern 2230 passes through the groove 2240 and moves along a front surface and a rear surface of the base member, a contact area can be further increased or contact efficiency can be further improved.

The resistive pattern 2230 is illustrated to be formed on the first flat surface 2210 but is not limited thereto and may also be formed on the second flat surface 2220.

Referring to FIG. 15, the flow path pattern may have variously modified examples.

For example, a pattern having a curvature may be repeated with a predetermined pitch P1 as illustrated in FIG. 15A, a pattern having a cutting edge portion may be repeated as illustrated in FIG. 15B, or unit patterns may also have polygonal shapes as illustrated in FIGS. 15C and 15D. Although not illustrated in the drawings, a resistive pattern may also be formed on each of surfaces B1 and B2 of the patterns.

In FIG. 15, the flow path pattern has a predetermined cycle and a height but is not limited thereto, and the cycle and the height T1 of the flow path pattern may be non-uniformly changed.

Referring back to FIGS. 1 to 9, the cooling/warming device 1000 according to the embodiment of the present invention includes an inlet 230 through which air is introduced into the case 200, an air blow pipe 240 through which air passing through the first heat transmission member 410 flows, an air blow port 250 through which air passing through the air blow pipe 240 is discharged, a discharge pipe 260 through which air passing through the second heat transmission member 420 flows, and a discharge outlet 270 through which air flowing through the discharge pipe 260 is discharged. The inlet 230, the air blow pipe 240, the air blow port 250, the discharge pipe 260, and the discharge outlet 270 may be formed on the lower case 210 and formed by coupling the lower case 210 and the upper case 220. In this case, the lower case 210 and the upper case 220 are illustrated to be coupled by bolts but are not limited thereto, and the lower case 210 and the upper case 220 may be coupled through various methods.

First, air introduced into the case 200 from outside of the cooling/warming device 1000 through the inlet 230 may be circulated by the fan 300 and moved toward the thermoelectric device 400. The first heat transmission member 410 and the second heat transmission member 420 included in the thermoelectric device 400 may be disposed in a direction of an air flow path formed from a side of the fan 300 toward a side of the air blow port 250. In a case in which the cooling/warming device 1000 is used as a cooling device, the lower substrate 110 of the thermoelectric element 100 becomes a heat-absorbing portion, thus the first heat transmission member 410 is cooled, the upper substrate 160 becomes a heating portion, and thus the second heat transmission member 420 is heated. Accordingly, some air circulated by the fan 300 and moved toward the thermoelectric device 400 may pass through the first heat transmission member 410 and be cooled, and some air which is remaining may pass through the second heat transmission member 420 and may be heated. In this case, the cooled air may be blown to the air blow port 250 through the air blow pipe 240, and the heated air may be discharged to the discharge outlet 270 through the discharge pipe 260. Conversely, in a case in which the cooling/warming device 1000 is used as a warming device, the lower substrate 110 of the thermoelectric element 100 becomes a heating portion, thus the first heat transmission member 410 is heated, the upper substrate 160 becomes a heat-absorbing portion, and thus the second heat transmission member 420 is cooled. Accordingly, some air circulated by the fan 300 and moved toward the thermoelectric device 400 may pass through the first heat transmission member 410 and be heated, and some air which is remaining may pass through the second heat transmission member 420 and may be cooled. In this case, the heated air may be blown to the air blow port 250 through the air blow pipe 240, and the cooled air may be discharged to the discharge outlet 270 through the discharge pipe 260.

That is, air, which is circulated by the fan 300 and passes through the first heat transmission member 410, may flow through the air blow pipe 240 and may be blown from the air blow port 250, and may be used for cooling or heating. In addition, air passing through the second heat transmission member 420 may flow through the discharge pipe 260 and may be discharged from the discharge outlet 270 to the outside.

According to the embodiment of the present invention, the discharge pipe 260 may be formed to include an inclined surface at a predetermined point between the second heat transmission member 420 and the discharge outlet 270. Accordingly, air discharged from the second heat transmission member 420 may be effectively discharged to the discharge outlet 270 without being hindered in a flow path.

More specifically, a direction D1 in which air is discharged through the air blow port 250 may be different from a direction D2 in which air is discharged through the discharge outlet 270. Accordingly, air, which is cooled or heated and discharged from the air blow port 250 to achieve performance of the cooling/warming device 1000, is not mixed with air, which is discharged from the discharge pipe 260 to be discharged after being used to cool or heat the air discharged from the air blow port 250, and thus cooling or heating performance can be improved.

To this end, the air blow port 250 may be disposed in a first side surface Si of the lower case 210, and the discharge outlet 270 may be disposed in a second side surface S2, which is different from the first side surface S1, of the lower case 210. In this case, the first side surface Si may be a surface disposed in a direction in which air is moved after the air is circulated by the fan 300 and cooled and heated by the thermoelectric device 400 and passes through the first heat transmission member 410 and the second heat transmission member 420. In addition, the second side surface S2 may be a surface disposed between the first side surface S1 and a third side surface S3 opposite to the first side surface S1.

In this case, the discharge outlet 270 may be formed in a region of the second side surface S2 which is closer to the third side surface S3 than the first side surface S1. For example, in a case in which the second side surface S2 is divided into two regions A1 and A2, the discharge outlet 270 may be disposed in the region A2. Then, since a distance between the discharge outlet 270 and the air blow port 250 increases, air discharged from the discharge outlet 270 may not be mixed with air blown from the air blow port 250.

In addition, the inlet 230 may be disposed in a side surface different from the first side surface S1, for example, in the second side surface S2, the third side surface S3 opposite to the first side surface S1, or a fourth side surface S4 opposite to the second side surface S2, and may preferably be disposed in the third side surface S3 or the fourth side surface S4.

As described above, when directions of the inlet 230, the air blow port 250, and the discharge outlet 270 are different from each other, since a problem, in which air blown from the air blow port 250 or air discharged from the discharge outlet 270 flows into the inlet 230 again, may be minimized, cooling/warming performance of the cooling/warming device can be improved.

Although not illustrated in the drawings, a separate air moving path may be further selectively connected to one or more of the inlet 230, the air blow port 250, and the discharge outlet 270 to further control an air introduction, blowing or discharging direction. In this case, directions in which air is initially introduced, finally blown or finally discharged through the air moving path selectively connected to the inlet 230, the air blow port 250, and the discharge outlet 270 may be different from each other.

Meanwhile, according to the embodiment of the present invention, the discharge outlet 270 in addition to the air blow pipe 240, air blow port 250, and the discharge pipe 260 may be formed in the lower case 210. For example, three surfaces of the discharge outlet 270 are formed due to the lower case 210, and one surface thereof may be covered by the upper case 220. Accordingly, since both of the air blow port 250 and the discharge outlet 270 of the cooling/warming device 1000 are formed in the lower case 210, the cooling/warming device 1000 can be manufactured to have a slim design. To this end, the discharge pipe 260 may be formed to be inclined from an outlet through which air passing through the second heat transmission member 420 is discharged to the discharge outlet 270 while being bent at a predetermined curvature. To this end, the discharge pipe 260 may include at least one inclined surface formed at a predetermined position. Accordingly, air passing through the second heat transmission member 420 may be discharged to the discharge outlet 270 through the discharge pipe 260 without being hindered in a flow path. The discharge pipe 260 may have a structure bent two or three times at a predetermined curvature.

In this case, the discharge pipe 260 is formed due to the lower case 210 and the upper case 220 being coupled, and air passing through the air blow pipe 240 may not be mixed with air passing through the discharge pipe 260. To this end, the discharge pipe 260 may be formed due to a discharge pipe bottom surface 212 included in the lower case 210 being coupled to a discharge pipe cover 222 formed in the upper case 220. In this case, the discharge pipe bottom surface 212 may include a dividing region 212-1, a bent region 212-2, an inclined region 212-3, and a discharge region 212-4, and the dividing region 212-1 may be a region disposed between an outlet through which air passing through the first heat transmission member 410 is discharged and the outlet through which air passing through the second heat transmission member 420 is discharged to be parallel to the lower substrate 110 and the upper substrate 160 of the thermoelectric device 400 and from which the air is divided. The air blow pipe 240 may be formed between the bottom surface of the lower case 210 and the dividing region 212-1. In addition, the bent region 212-2 may be a region which extends from the dividing region 212-1, is bent at a predetermined curvature, and changes a path of air which passes through the second heat transmission member 420 and flows in the dividing region 212-1. In addition, the inclined region 212-3 may be a region through which air passing through the bent region 212-2 is moved to the discharge region 212-4, and heights of bottom surfaces of regions are different such that an initial height of the air passing through the bent region 212-2 is different from a final height of the air transmitted to the discharge region 212-4, and the final height of the air transmitted to the discharge region 212-4 may be lower than the initial height of the air passing through the bent region 212-2. That is, a height of the inclined region 212-3 at a starting point thereof may be higher than a height of the inclined region 212-3 at an ending point thereof. The height of the inclined region 212-3 at the starting point may be linearly, nonlinearly, cycloidally, or stepwise decreased to the height of the inclined region 212-3 at the ending point. That is, a form having a linear type slope, a slope with a curvature, a step in a stair type, or a combination of a slope and a step may be disposed between the bottom surfaces of the regions. A position of the inclined region 212-3 is not limited thereto, and the inclined region 212-3 may be disposed in the dividing region 212-1, the bent region 212-2, or the discharge region 212-4 or disposed between the dividing region 212-1 and the bent region 212-2 and may be preferably formed in a region spaced far apart from the air blow pipe 240, that is, a region adjacent to the discharge outlet 270, so as to minimize a thermal effect on air passing through the air blow pipe 240. For example, the inclined region 212-3 may be disposed in a direction opposite to the direction D1 in which air passing through the first heat transmission member 410 is discharged to the air blow port 250 through the air blow pipe 240.

Accordingly, air passing through the first heat transmission member 410 and air passing through the second heat transmission member 420 may be divided by the dividing region 212-1, the air passing through the first heat transmission member 410 may be discharged through the air blow port 250, and the air passing through the second heat transmission member 420 may be discharged through the discharge outlet 270.

Meanwhile, according to the embodiment of the present invention, the cooling/warming device 1000 may further include two or more buffer members 700 disposed on an upper surface of the fan 300, and the buffer members 700 may be in contact with the upper case 220. The buffer member 700 may be a member having elasticity and may be adhered or connected to the upper surface of the fan 300. Accordingly, a problem of noise generated due to contact between the fan 300 and the upper case 220 when the fan 300 vibrates can be prevented. Preferably, two or more protrusions 224 may be formed on an inner surface of the upper case 220, and the buffer member 700 may be in contact with the protrusion 224.

Meanwhile, according to the embodiment of the present invention, at least one groove G may be disposed in at least one outer surface of the lower case 210 and the upper case 220. For example, the groove G may be disposed in a surface disposed at the side surface of the fan 300 among a plurality of outer surfaces of the upper case 220. In this case, the surface disposed on the side surface of the fan 300 may be disposed to have a predetermined inclination with respect to a surface disposed on the upper surface of the fan 300, and a plurality of grooves identical to the groove G may have a predetermined pattern. In addition, a depth H of the groove G may range from 0.5 to 1.5 times a width W of the groove G. As described above, when the surface disposed on the side surface of the fan 300 has the predetermined inclination with respect to the surface disposed on the upper surface of the fan 300, the fan 300 can be stably accommodated in the upper case 220, and a flow path of the discharge pipe 260 can be easily designed. In addition, when the groove G has the predetermined pattern and the depth H of the groove G ranges from 0.5 to 1.5 times the width of the groove G, a weight of the case 200 can be reduced, a material cost can be reduced, and a mechanical strength of the case 200 can also be suitably maintained.

Alternatively, the groove G may also be formed in a region corresponding to the inclined region 212-3 among the plurality of outer surfaces of the lower case 210. In this case, the plurality of grooves G formed in the lower case 210 may have a predetermined inclination and a predetermined pattern, and inclinations of some of the plurality of grooves may be different from inclinations of the remaining grooves. In addition, the depth H of the groove G may range from 0.5 to 1.5 times the width W of the groove G, and depths of some of the plurality of grooves may be different from depths of the remaining grooves. Accordingly, a weight of the case 200 can be reduced, a material cost can be reduced, a mechanical strength of the case 200 can also be suitably maintained, and the case 200 can be firmly fixed because sliding can be prevented when the case 200 is installed in an application product in which vibration occurs.

While the invention has been shown and described with reference to the exemplary embodiments thereof, it will be understood by those skilled in the art that various changes in form and details may be made therein without departing from the spirit and scope of the invention as defined by the appended claims.

The invention claimed is:

1. A cooling/warming device comprising:
a case including a lower case and an upper case coupled to the lower case;
a fan which is accommodated in the case and circulates air introduced into the case;
a thermoelectric device which is accommodated in the case, is disposed on a side surface of the fan, cools some air generated by the fan, and heats the remaining air; and
a controller which is connected to the thermoelectric device and the fan and controls operation of the thermoelectric device and the fan,
wherein the thermoelectric device includes a first heat transmitter disposed at a side of the lower case, a second heat transmitter disposed at a side of the upper case, and a thermoelectric element disposed between the first heat transmitter and the second heat transmitter,
wherein the thermoelectric element includes a first substrate disposed at a side of the first heat transmitter, a second substrate disposed at a side of the second heat transmitter, and a plurality of P-type thermoelectric legs and a plurality of N-type thermoelectric legs alternately disposed between the first substrate and the second substrate,
the case includes an inlet through which air is introduced into the case, an air blow pipe through which air passing through the first heat transmitter flows, an air blow port from which the air flowing through the air blow pipe is discharged, a discharge pipe through which air passing through the second heat transmitter flows, and a discharge outlet from which the air flowing through the discharge pipe is discharged, and a bottom surface of the discharge pipe includes inclined regions having different heights at a predetermined point,
wherein the bottom surface of the discharge pipe further includes a dividing region which divides the air passing through the first heat transmitter from the air passing through the second heat transmitter, a bent region which changes a path of the air passing through the second heat transmitter, and a discharge region from which the air passing through the second heat transmitter is discharged to the discharge outlet,
wherein the inclined region is disposed between the bent region and the discharge region.

2. The cooling/warming device of claim 1, wherein a height of a bottom surface of the bent region is higher than a height of a bottom surface of the discharge region.

3. The cooling/warming device of claim 1, wherein the inclined region has any one form among a slope in a linear type, a slope having a curvature, and a step in a stair type.

4. The cooling/warming device of claim 1, wherein a direction in which air is blown through the air blow port is different from a direction in which air is discharged through the discharge outlet.

5. The cooling/warming device of claim 1, wherein the bent region of the discharge pipe is formed to be bent from an outlet, from which the air passing through the second heat transmitter is discharged, to the discharge outlet while having a predetermined curvature.

6. The cooling/warming device of claim 1, wherein:
the discharge pipe is formed due to a space between the lower case and the upper case; and
air flowing through the air blow pipe and air flowing through the discharge pipe are not mixed.

7. The cooling/warming device of claim 1, wherein:
the dividing region of the discharge pipe is disposed between an outlet through which the air passing through the first heat transmitter is discharged and an outlet through which the air passing through the second heat transmitter is discharged to be parallel to the first substrate and the second substrate of the thermoelectric device; and
the bent region is disposed between the dividing region and the inclined region.

8. The cooling/warming device of claim 7, wherein the air blow pipe is disposed between a bottom surface of the lower case and the dividing region.

9. The cooling/warming device of claim 1, further comprising two or more buffers disposed on an upper surface of the fan,
wherein the buffers are in contact with the upper case.

10. The cooling/warming device of claim 9, wherein:
two or more protrusions are formed on an inner surface of the upper case; and
the buffers are in contact with the protrusion.

11. The cooling/warming device of claim 1, wherein:
when cooled air is discharged through the air blow port, heated air is discharged through the discharge outlet; and
when heated air is discharged through the air blow port, cooled air is discharged through the discharge outlet.

12. A cooling/warming device comprising:
a case including a lower case and an upper case coupled to the lower case;
a fan which is accommodated in the case and circulates air introduced into the case;
a thermoelectric device which is accommodated in the case, is disposed on a side surface of the fan, cools some air generated by the fan, and heats the remaining air; and
a controller which is connected to the thermoelectric device and the fan and controls operation of the thermoelectric device and the fan,
wherein the thermoelectric device includes a first heat transmitter disposed at a side of the lower case, a second heat transmitter disposed at a side of the upper case, and a thermoelectric element disposed between the first heat transmitter and the second heat transmitter,
wherein the thermoelectric element includes a first substrate disposed at a side of the first heat transmitter, a second substrate disposed at a side of the second heat transmitter, and a plurality of P-type thermoelectric legs and a plurality of N-type thermoelectric legs alternately disposed between the first substrate and the second substrate,
the case includes an inlet through which air is introduced into the case, an air blow pipe through which air passing through the first heat transmitter flows, an air blow port from which the air flowing through the air blow pipe is discharged, a discharge pipe through which air passing through the second heat transmitter flows, and a discharge outlet from which the air flowing through the discharge pipe is discharged, and a bottom surface of the discharge pipe includes inclined regions having different heights at a predetermined point,
wherein a direction in which air is blown through the air blow port is different from a direction in which air is discharged through the discharge outlet,
the air blow port is disposed on a first side surface of the lower case; and
the inlet is disposed on a third side surface opposite to the first side surface.

13. The cooling/warming device of claim 12, wherein the discharge outlet is disposed on a second side surface between the first side surface and the third side surface.

14. The cooling/warming device of claim 12, wherein the first side surface is a surface disposed in a direction in which air generated by the fan passes through the first heat transmitter and the second heat transmitter.

15. The cooling/warming device of claim 13, wherein the discharge outlet is formed in a region of the second side surface that is closer to the third side surface than the first side surface.

16. A cooling/warming device comprising:
a case including a lower case and an upper case coupled to the lower case;
a fan which is accommodated in the case and circulates air introduced into the case;
a thermoelectric device which is accommodated in the case, is disposed on a side surface of the fan, cools some air generated by the fan, and heats the remaining air; and
a controller which is connected to the thermoelectric device and the fan and controls operation of the thermoelectric device and the fan,
wherein the thermoelectric device includes a first heat transmitter disposed at a side of the lower case, a second heat transmitter disposed at a side of the upper case, and a thermoelectric element disposed between the first heat transmitter and the second heat transmitter,
wherein the thermoelectric element includes a first substrate disposed at a side of the first heat transmitter, a second substrate disposed at a side of the second heat transmitter, and a plurality of P-type thermoelectric legs and a plurality of N-type thermoelectric legs alternately disposed between the first substrate and the second substrate,
the case includes an inlet through which air is introduced into the case, an air blow pipe through which air passing through the first heat transmitter flows, an air blow port from which the air flowing through the air blow pipe is discharged, a discharge pipe through which air passing through the second heat transmitter flows, and a discharge outlet from which the air flowing through the discharge pipe is discharged, and a bottom surface of the discharge pipe includes inclined regions having different heights at a predetermined point,
wherein a plurality of grooves are formed in at least one outer surface of the upper case and the lower case.

17. The cooling/warming device of claim 16, wherein the plurality of grooves are formed in a region corresponding to the inclined region of the outer surface of the lower case.

18. The cooling/warming device of claim 17, wherein the plurality of grooves of the lower case include a predetermined inclination and a predetermined pattern.

19. The cooling/warming device of claim 18, wherein a depth of the groove ranges from 0.5 to 1.5 times a width of the groove.

* * * * *